(12) United States Patent
Beacham

(10) Patent No.: US 10,576,430 B2
(45) Date of Patent: Mar. 3, 2020

(54) SYSTEM AND METHOD FOR MANUFACTURING A MEMBRANE FILTER

(71) Applicant: GENERAL ELECTRIC COMPANY, Schenectady, NY (US)

(72) Inventor: Jimmie Autrey Beacham, West Allis, WI (US)

(73) Assignee: General Electric Company, Schenectady, NY (US)

( * ) Notice: Subject to any disclaimer, the term of this patent is extended or adjusted under 35 U.S.C. 154(b) by 123 days.

(21) Appl. No.: 15/837,430

(22) Filed: Dec. 11, 2017

(65) Prior Publication Data
US 2019/0176093 A1 Jun. 13, 2019

(51) Int. Cl.
*B01D 67/00* (2006.01)
*B01D 71/50* (2006.01)
*G03F 7/12* (2006.01)

(52) U.S. Cl.
CPC ..... *B01D 67/0034* (2013.01); *B01D 67/0032* (2013.01); *B01D 71/50* (2013.01); *G03F 7/12* (2013.01); *B01D 2323/34* (2013.01); *B01D 2323/42* (2013.01)

(58) Field of Classification Search
CPC ............... B01D 67/0034; B01D 71/50; B01D 2323/42; B01D 2323/34; B01D 67/003; B01D 67/0032; B01D 67/0053; B01D 67/006; B01D 67/0062; B01D 2323/28; B01D 2323/283; G03F 1/80; G03F 1/82; G03F 7/00; G03F 7/0002; G03F 7/0015; G03F 7/0035; G03F 9/00; G03F 9/70; G03F 9/7019; G03F 9/7023; G03F 9/7042; G03F 9/7049; G03F 9/7053; H01J 37/30; H01J 37/305; H01J 37/3053; H01J 37/3056

USPC ............. 210/500.21, 500.22, 500.25, 500.4; 216/2, 41, 48, 83, 84, 90, 92, 96; 430/259, 296, 297, 310, 320, 323, 329

See application file for complete search history.

(56) References Cited

U.S. PATENT DOCUMENTS

| | | | |
|---|---|---|---|
| 4,832,997 A | 5/1989 | Balanzat | |
| 4,872,888 A | 10/1989 | Ehrfeld et al. | |
| 5,753,014 A * | 5/1998 | Van Rijn ............ | B01D 39/1692 55/524 |
| 6,831,742 B1 * | 12/2004 | Sui ........................ | G01N 21/21 356/369 |

(Continued)

FOREIGN PATENT DOCUMENTS

| | | |
|---|---|---|
| EP | 2980139 A4 | 11/2016 |
| WO | 199830317 W | 7/1998 |
| WO | 2008112888 A1 | 9/2008 |

OTHER PUBLICATIONS

European application 18210789.6—Extended Search Report dated May 7, 2019; 7 pages.

(Continued)

*Primary Examiner* — Joseph W Drodge
(74) *Attorney, Agent, or Firm* — Eversheds Sutherland (US) LLP

(57) ABSTRACT

A system for manufacturing a membrane filter is provided. The system includes a radiation source operative to emit radiation that contacts discrete portions of a filter substrate so as to facilitate the formation of openings within the filter substrate, and a collimator disposed between the filter substrate and the radiation source and operative to restrict some of the radiation from contacting the filter substrate.

14 Claims, 4 Drawing Sheets

(56) References Cited

U.S. PATENT DOCUMENTS

| | | | | | |
|---|---|---|---|---|---|
| 7,282,240 | B1* | 10/2007 | Jackman | ............... | B82Y 10/00 427/282 |
| 7,960,708 | B2* | 6/2011 | Wolfe | ............... | B01D 67/0034 216/56 |
| 2004/0124092 | A1* | 7/2004 | Black | ............... | B01D 67/0062 205/363 |
| 2009/0073400 | A1* | 3/2009 | Wolfe | ............... | B01D 67/0034 355/53 |
| 2010/0020299 | A1* | 1/2010 | Zebala | ............... | G03B 27/54 355/67 |
| 2011/0139707 | A1* | 6/2011 | Siwy | ............... | B01D 67/0062 210/500.21 |
| 2011/0215045 | A1* | 9/2011 | Zhou | ............... | B01D 39/1692 210/489 |
| 2012/0037591 | A1* | 2/2012 | Tringe | ............... | B01D 67/0062 216/2 |
| 2013/0160785 | A1* | 6/2013 | Thevenet | ............... | A61K 8/0241 132/200 |
| 2014/0021133 | A1* | 1/2014 | Siwy | ............... | B01D 67/0062 210/650 |
| 2014/0154464 | A1* | 6/2014 | Miller | ............... | B01D 39/2055 428/137 |
| 2015/0253127 | A1* | 9/2015 | Hughes | ............... | G01B 11/0625 250/358.1 |
| 2016/0009049 | A1* | 1/2016 | Stoltenberg | ............... | B32B 9/045 428/137 |
| 2016/0179007 | A1* | 6/2016 | Holst | ............... | G03F 1/20 216/41 |
| 2018/0319943 | A1* | 11/2018 | Liu | ............... | A61L 27/00 |

OTHER PUBLICATIONS

Han K et al: "Fabrication and characterization of polymeric microfiltration membranes using aperture array lithography", Journal of Membrane Science, Elsevier BV, NL, vol. 249, No. 1-2, Mar. 1, 2005 (Mar. 1, 2005), pp. 193-2-6, XP027869241, ISSN: 0376-7388 [retrieved on Mar. 1, 2005].

* cited by examiner

SYSTEM AND METHOD FOR MANUFACTURING A MEMBRANE FILTER

BACKGROUND

Technical Field

Embodiments of the invention relate generally to manufacturing, and more specifically, to a system and method for manufacturing a membrane filter.

Discussion of Art

Many medical and industrial processes use devices, commonly referred to as membrane filters, to separate particles and/or molecules of different substances from one another, e.g., filtering salts out of water. Such membranes are often formed by exposing a polycarbonate film to alpha-particles, which alter/change the material properties of the portions of the film contacted by the alpha-particles so as to make them susceptible to etching via a chemical agent, i.e., an etchant. Upon exposure to an etchant, the altered portions are removed from the film, thus leaving small pores which allow particles/molecules to pass through the film.

Many such methods of forming membrane filters involve a batch process in which a static quantity of polycarbonate film is exposed to a static radiation source, i.e., a radiation source that emits a constant amount of radiation, within a radiation containment chamber for a pre-determined exposure time. Typically, the longer/shorter the exposure time, the greater/fewer the number of pores created within the polycarbonate film, and the faster/slower the predicted/theoretical flow rate of the membrane filter, i.e., the speed at which a given quantity of a substance may pass through the filter.

The actual flow rates of many membrane filters formed by such batch processes, however, are often different than the predicted/theoretical one. Thus, the level of flow rate control available for many medical and/or industrial applications is presently limited. Further, the maximum fineness of traditional membrane filters, i.e., the maximum size of particles allowed to pass through the membrane filters, formed by such batch processes, has been found to be limited. In other words, traditional methods of manufacturing membrane filters via exposure to alpha particles have plateaued in their ability to create membrane filters of increasing fineness.

What is needed, therefore, is an improved system and method for manufacturing a membrane filter.

BRIEF DESCRIPTION

In an embodiment, a system for manufacturing a membrane filter is provided. The system includes a radiation source operative to emit radiation that contacts discrete portions of a filter substrate so as to facilitate the formation of openings within the filter substrate, and a collimator disposed between the filter substrate and the radiation source and operative to restrict some of the radiation from contacting the filter substrate.

In another embodiment, a method for manufacturing a membrane filter is provided. The method includes contacting discrete portions of a filter substrate with radiation emitted from a radiation source so as to facilitate the formation of openings within the filter substrate, and restricting some of the radiation via a collimator disposed between the filter substrate and the radiation source.

In yet another embodiment, a membrane filter is provided. The membrane filter is formed by: contacting discrete portions of a filter substrate with radiation emitted from a radiation source so as to facilitate the formation of a plurality of openings within the filter substrate; and restricting some of the radiation via a collimator disposed between the filter substrate and the radiation source. The plurality of openings has an average uniformity of between about $300 \times 10^6/cm^2$ to about $1000 \times 10^6/cm^2$.

In still yet another embodiment, a membrane filter is provided. The membrane filter includes a filter substrate including a plurality of openings having an average uniformity of between about $300 \times 10^6/cm^2$ to about $1000 \times 10^6/cm^2$.

DRAWINGS

The present invention will be better understood from reading the following description of non-limiting embodiments, with reference to the attached drawings, wherein below:

DETAILED DESCRIPTION

Figure 1:
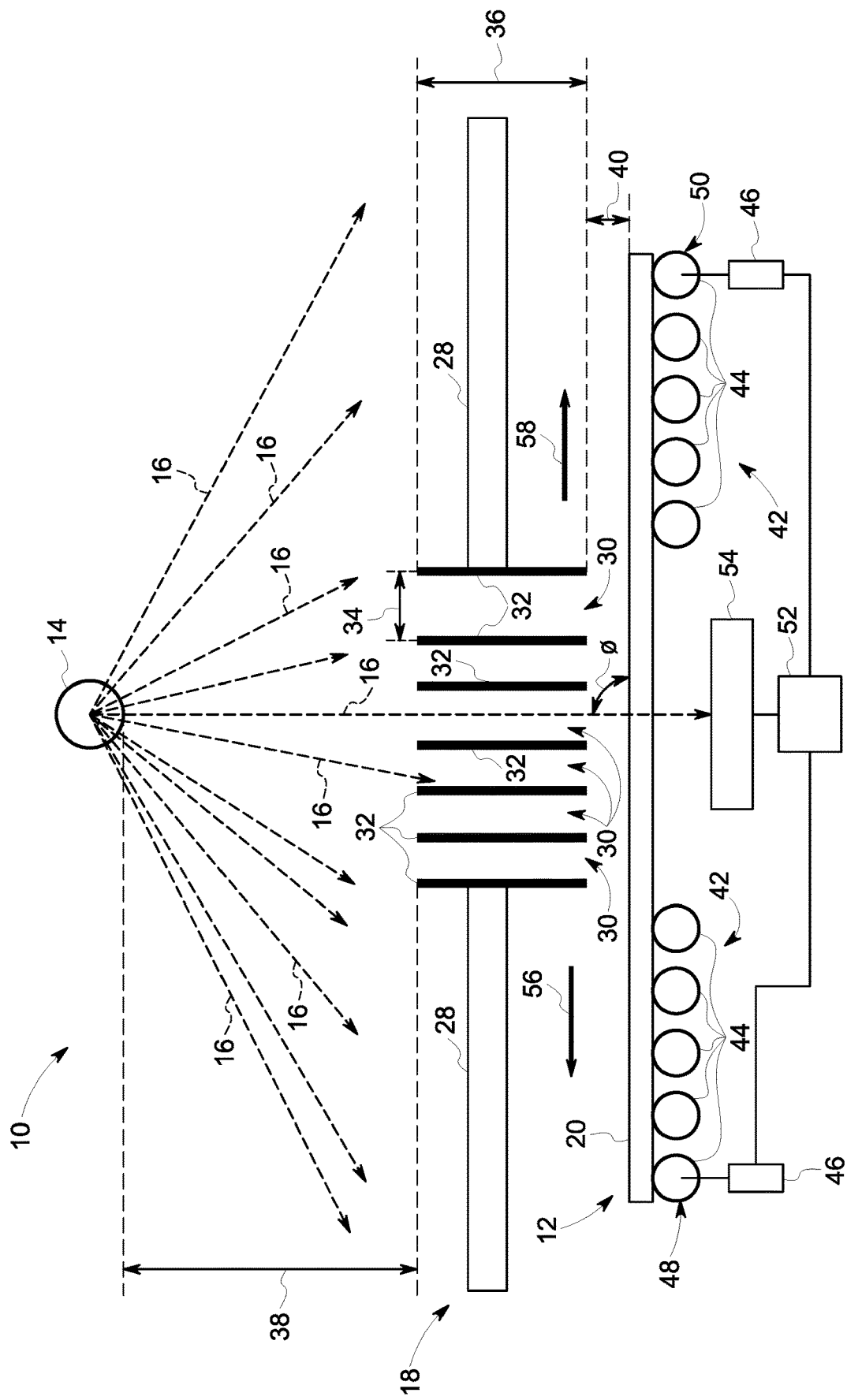
FIG. 1 is a diagram of a system for manufacturing a membrane filter, in accordance with an embodiment of the present invention.

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled," "electrically connected," and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present. The term "real-time," as used herein, means a level of processing responsiveness that a user senses as sufficiently immediate or that enables the processor to keep up with an external process. The term "fineness," as used herein, refers to the maximum size of a particle allowed to pass through a membrane filter, e.g., a low fineness has a maximum particle size that is larger than the maximum particle size of a high fineness. As used herein, the terms "flux" and "radiation flux" refer to the amount of radiation traversing an object over a period of time.

Additionally, while the embodiments disclosed herein are described with respect to membrane filters, it is to be understood that embodiments of the present invention are equally applicable to other processes and/or devices in which radiation is used to facilitate the creation of openings/pores in an object.

Referring now to FIG. 1, the major components of a system 10 for manufacturing a membrane filter 12 (best seen in FIGS. 3 and 4), in accordance with an embodiment of the invention, is shown. The system 10 includes a radiation source 14 operative to emit radiation 16, and a collimator 18 disposed between the radiation source 14 and a filter substrate 20. As illustrated in FIG. 1, the radiation 16 contacts discrete portions 22 (FIGS. 3 and 4) of the filter substrate 20 to facilitate the formation of openings 24 (FIGS. 3 and 4) within the filter substrate 20. In embodiments, the system 10 may further include an etcher 26 (FIG. 2) that is operative to form the openings 24 by removing the discrete portions 22 of the filter substrate that have been contacted by the radiation 16. As will be explained in greater detail below, the collimator 18 is operative to restrict some of the radiation 16 from contacting the filter substrate 20.

In embodiments, the radiation source 14 may be static, i.e., the rate that the radiation 16 is emitted by the source 14, also referred to herein as the "emission rate" of the radiation source 14, is constant, or substantially constant. In other embodiments, the radiation source 14 may be dynamic, i.e., the emission rate of the radiation source 14 is selectively adjustable. In embodiments, the radiation 16 may be particle radiation such as alpha-particles, protons, helium ions, beta particles, neutrons, neutrinos, mesons, muons, or other types of subatomic particles capable of altering a substance upon contact; and/or electromagnetic radiation such as x-rays, gamma-rays, or other types of photons capable of altering a substance upon contact.

The filter substrate 20 may be formed of a material that is operative to be altered/changed by the radiation 16 upon contact in a manner that facilitates the creation/formation of the openings 24. For example, in embodiments, the filter substrate 20 may be made of polycarbonate, which as will be understood, becomes altered when contacted by alpha particles such that it may be etched away via Sodium Hydroxide and/or other etching solutions. The filter substrate 20 may be substantially flexible and have a shape that is substantially rectangular, circular, or other shape appropriate for use as a membrane filter. The thickness of the filter substrate 20 may vary from about 0.010 mm to about 0.025 mm.

The collimator 18 may have a body 28 with one or more openings 30 which, in embodiments, may be defined by one or more fins 32. The openings 30 may be aligned with respect to the radiation source 14 and the filter substrate 20 such that any, or most, of the radiation 16 that contacts the filter substrate 20 does so at an angle of incidence Ø that ranges from about 70° to about 90°. The openings 30 may have a width 34, e.g., the distance between fins 32, of about 0.500 mm to about 2.000 mm, and a length 36 of about 3 cm to about 10 cm. In embodiments, the collimator 18 may be spaced at a distance 38 from the radiation source 14 of about 100 cm to about 500 cm, and at a distance 40 from the filter substrate 20 of about 1 cm to about 500 cm. In embodiments, the body 28 may include tungsten and/or other materials suitable for restricting the movement of the radiation 16. As will be appreciated, in embodiments, the body 28 may be additively manufactured such that it includes internal cooling channels.

As further shown in FIG. 1, the system 10 may include an adjustable support 42, e.g., one or more rollers 44 and or a similar conveyor belt system powered by one or more motors 46, for supporting the filter substrate 20 and/or moving the filter substrate 20 with respect to at least one of the radiation source 14 and the collimator 18. In embodiments, the adjustable support 42 may include two rollers 44 that act as drums for the filter substrate 20, i.e., the filter substrate 20 may be "unrolled" from a first roller/drum 48 and "rolled" onto a second roller/drum 50.

As yet further shown in FIG. 1, the system 10 may also include a controller 52 in electronic communication with one or more of the components of the system 10, and/or a radiation detector/sensor 54 disposed on a side of the filter substrate 20 opposite the radiation source 14 and/or opposite the side of the filter substrate 20 which is contacted by the radiation 16. As will be appreciated, the detector 54 is operative to obtain one or more measurements of the flux of the radiation 16 across the filter substrate 20. In embodiments, the detector 54 may include a direct conversion sensor that uses a material, e.g., Cadmium Zinc Telluride ("CZT"), to convert radiation 16 energy into an electrical charge. In other embodiments, the detector 54 may include a scintillation sensor that converts radiation 16 energy to photons, which may then be measured by a photon multiplier tube.

As will also be explained in greater detail below, the controller 52, via the radiation source 14, the collimator 18, and/or the adjustable support 42, may adjust the radiation 16 flux across the filter substrate 20 based at least on part on the one or more measurements of the flux obtained by the radiation detector 54. In other words, the controller 52, the radiation source 14, the collimator 18, and/or the adjustable support 42 may form a feedback look that regulates/controls the flux of the radiation 16 across the filter substrate 20, which in turn, regulates/controls the amount of radiation 16 that contacts a given portion/section/area of the filter substrate 20.

Thus, in operation, according to an embodiment, some of the radiation emitted from the radiation source 14 is restricted by the collimator 18, as represented by the dashed arrows 16 that terminate at or prior to the collimator 18, while radiation emitted by the source 14 which is aligned with the openings 30 is allowed to pass through the collimator 18 so as to contact the discrete portions 22 (FIGS. 3 and 4), as represented by the dashed arrow 16 that terminates at the radiation detector 54. Thus, as used herein with respect to the restricted radiation, the term "some of" refers to subatomic particles and/or photons of radiation 16 emitted by the radiation source 14 that have trajectories that would contact/intercept the filter substrate 20 outside the desired angle of incidence Ø. Accordingly, the collimator 18 encourages/improves the percentage of radiation 16 particles and/or rays that contact/intercept the filter substrate 20 at the desired angle of incidence Ø, and decreases the percentage of radiation 16 particles and/or rays that contact/intercept the filter substrate 20 outside the desired angle of incidence Ø.

Figure 2:
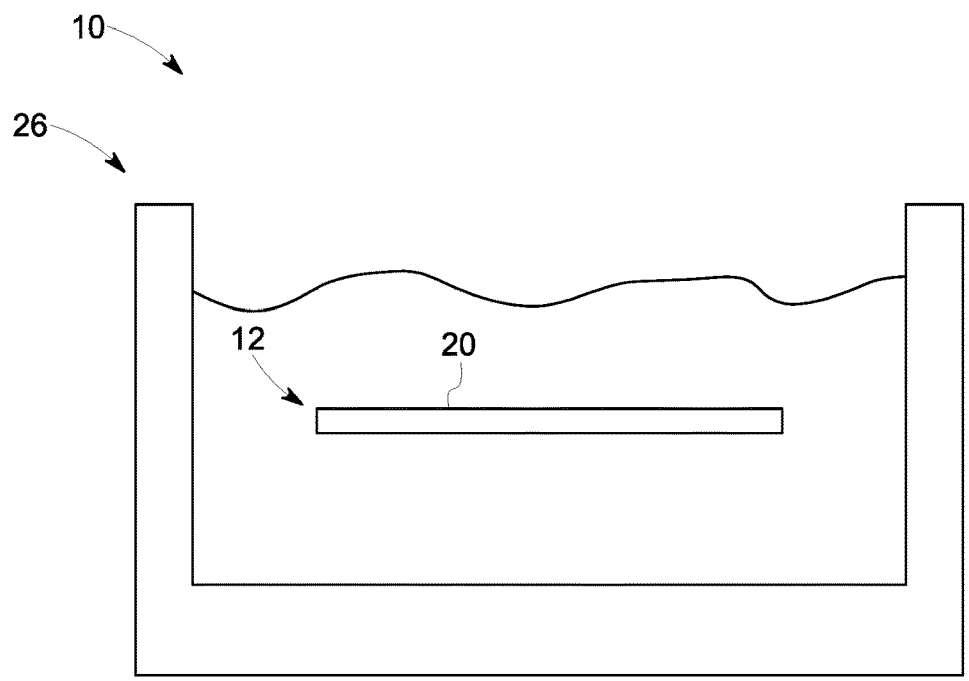
FIG. 2 is a diagram of an etcher of the system of FIG. 1, in accordance with an embodiment of the present invention.

Upon being contacted by the radiation 16 that passes though the collimator 18, the discrete portions 22 of the filter substrate become altered such that they may be removed, e.g., via an etchant. Thus, after having been exposed/contacted by a predetermined amount of the radiation 16, the discrete portions 22 may be removed via an etcher 26, e.g., an etching tank, as shown in FIG. 2, such that the openings 24 are formed.

Figure 3:
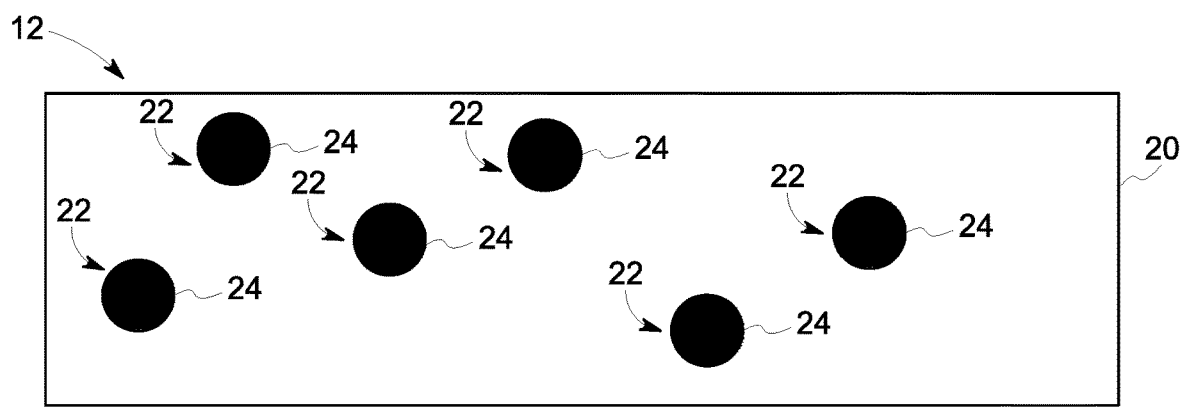
FIG. 3 is a diagram depicting a top-down view of a membrane filter manufactured by the system of FIG. 1, in accordance with an embodiment of the present invention.
Figure 4:
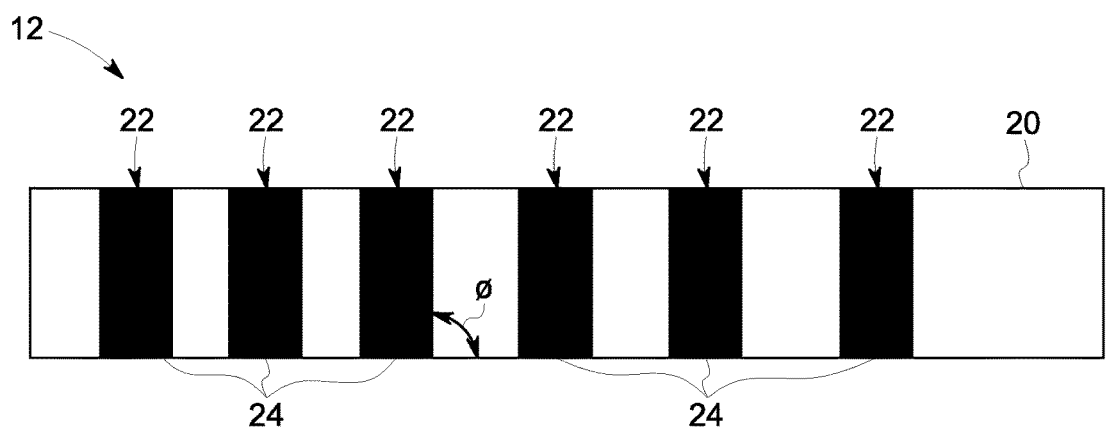
FIG. 4 is a diagram depicting a side-profile view of the membrane filter of FIG. 3, in accordance with an embodiment of the present invention.

As illustrated in FIGS. 3 and 4, by restricting the radiation 16 such that it contacts the filter substrate 20 at, or substantially near, the angle of incidence Ø, the openings/pores 24 are relatively uniform and unlikely to intersect one another. As will be appreciated, reducing the number of intersecting openings 24 improves the fineness and/or the predictability of the flow rate of the membrane 12 as intersecting openings often allow particles of a substance, too large to pass through a single opening 24, to pass through the filter substrate 20. Put another way, intersecting openings/pores 24 may act as an opening having double the size of a non-intersecting opening. Thus, as will be appreciated, increasing the percentage of radiation 16 contacting the filter substrate at and/or near the angle of incidence Ø improves the positional distribution and/or angularity of the pores/tracks/openings 24 created through the filter substrate/film 20.

As can be further seen in FIGS. 3 and 4, the amount of radiation 16 a particular section of the filter substrate 20 is contacted with corresponds to the density of the openings 24 within the section. In other words, the more/less radiation 16 contacting a section of the filter substrate 20 prior to etching, the larger/smaller the number of openings/pores 24 within the section. Thus, in embodiments, the controller 52 may regulate/control the amount of radiation 16 received by portions of the filter substrate 20 by regulating/controlling the flux of the radiation across the filter substrate 20.

For example, returning back to FIG. 1, in embodiments, the controller 52 may adjust the flux across the filter substrate 20 by moving the filter substrate 20, via the support 42, in the direction of arrows 56 and/or 58, across the zone of impact of the radiation 16 at a rate of about 1 mm/sec to about 100 mm/sec. As used herein with respect to the radiation 16 and filter substrate 20, the terms "zone of impact" and "impact zone" refer to the region of the filter substrate that has a high likelihood of coming into contact with radiation 16 that has passed through the collimator 18. Thus, the speed at which the filter substrate 20 is moved through the impact zone partially determines the amount of time that a particular section of the filter substrate 20 is contacted by radiation 16, which, in turn partially determines the flux across the across the filter substrate 20.

Figure 5:
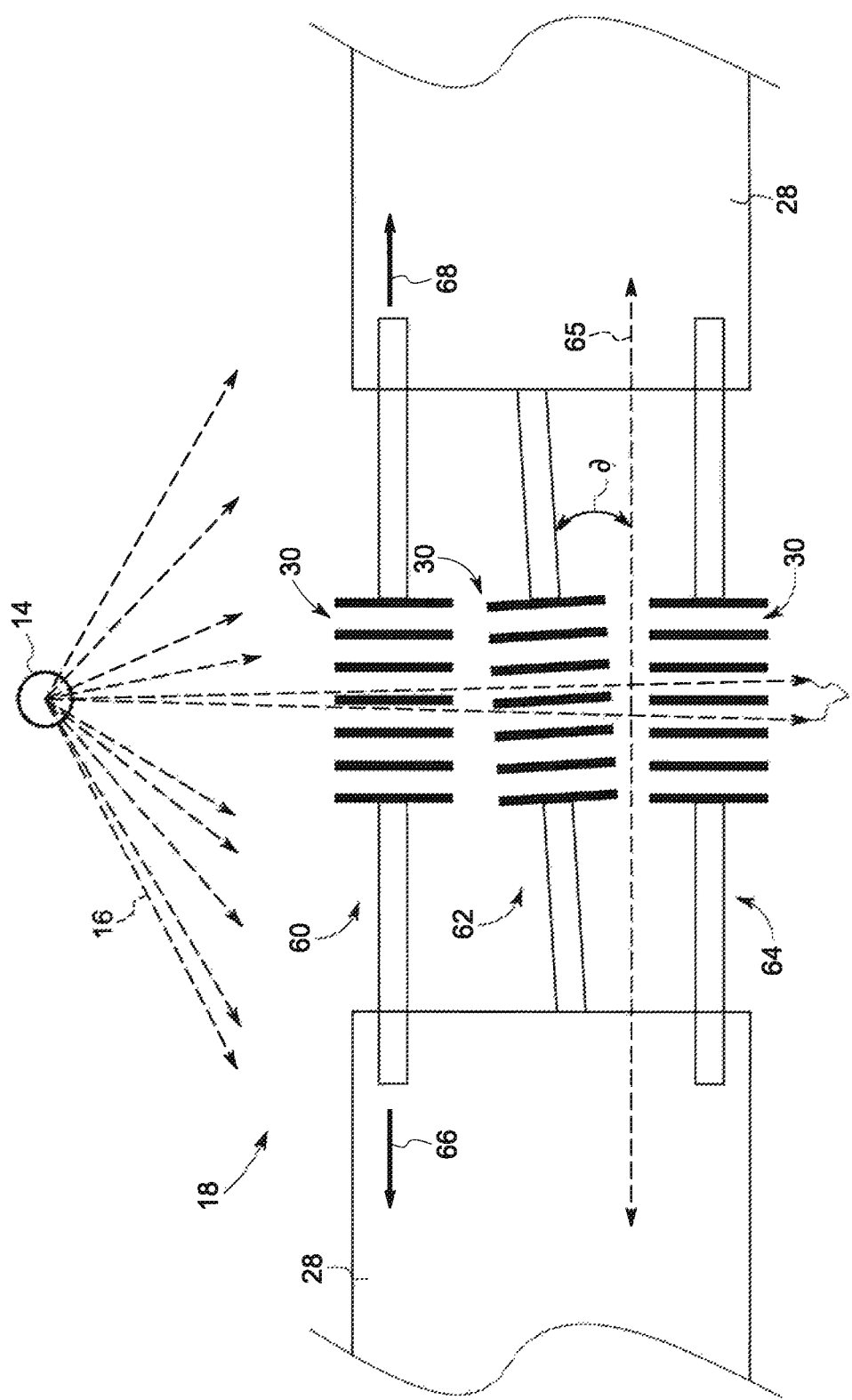
FIG. 5 is a diagram of a collimator of the system of FIG. 1, in accordance with an embodiment of the present invention.

Moving to FIG. 5, in embodiments, the controller 52 may adjust the radiation 16 flux across the filter substrate 20 by adjusting the collimator 18. For example, in embodiments, the collimator 18 may further include one or more layers 60, 62, 64 each having at least one opening 30 such that adjusting the alignment of the openings 30 of the layers 60, 62, 64 with respect to one another, increases/decreases the width of the paths through the collimator 18. For example, a first layer 60 may be moved in a transverse direction (as shown by arrows 66 and 68) while the remaining layers 62, 64 are kept stationary. As will be appreciated, moving the first layer 62 in such a manner increases/decreases the cumulative effective/overlapping width of the openings 30, which in turn, increases/decreases the amount of radiation 16 allowed to pass through the body 28. Similarly, in embodiments, the cumulative effective/overlapping width of the openings 30 may be increased/decreased via tilting a second layer 62 along an angle ∂ with respect to a horizontal axis 65 of the other layers 60, 64. In embodiments, ∂ may range from about 0° to about 45°.

Figure 6:
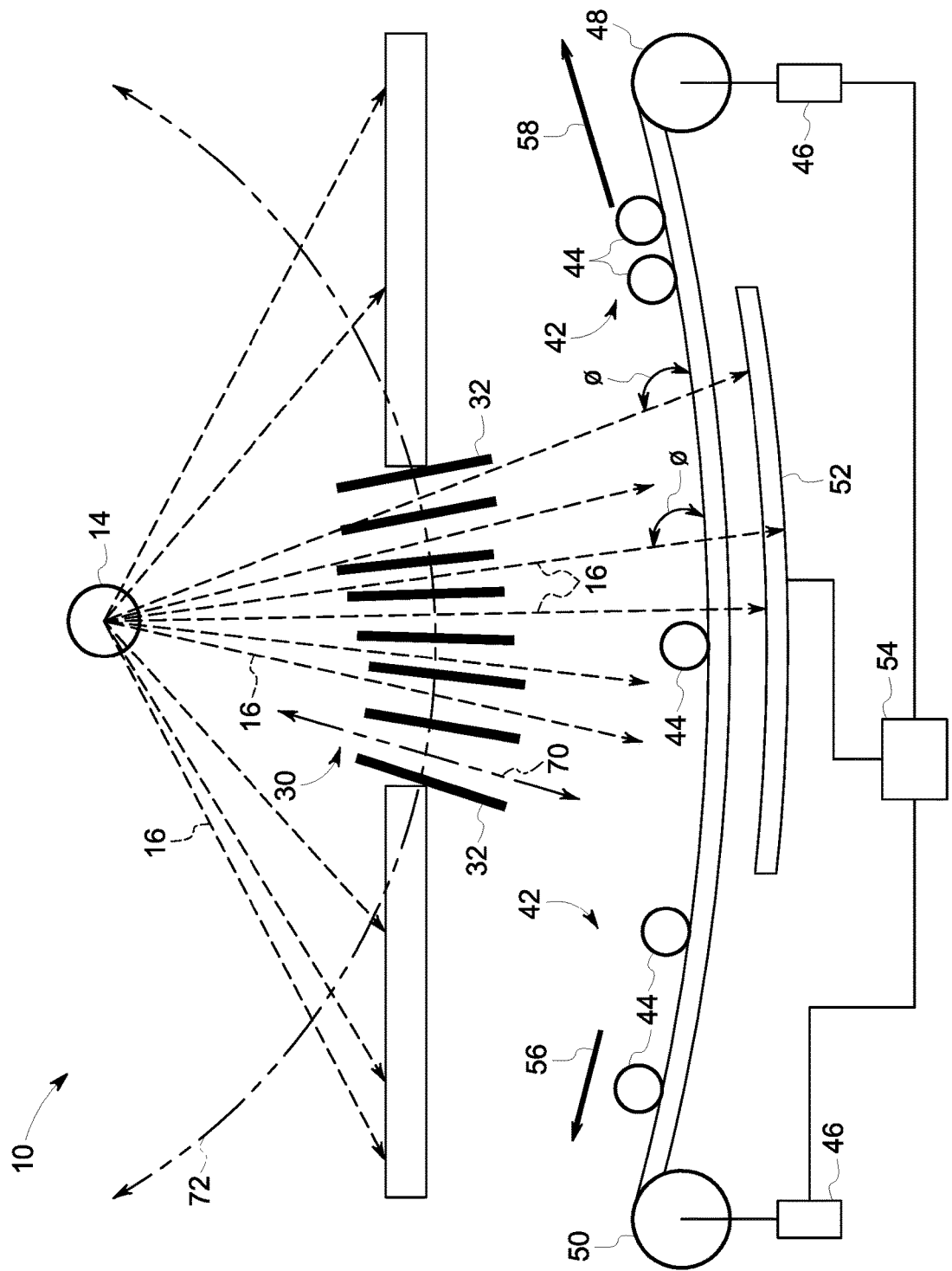
FIG. 6 is a diagram of another embodiment of the collimator of the system of FIG. 1, in accordance with an embodiment of the present invention.

Referring now to FIG. 6, in embodiments, the openings 30 of the collimator 18 may be radially aligned with the radiation source 14, i.e., the longitudinal axis 70 of the openings 30 is perpendicular and/or normal to an arc 72 that corresponds to the imaginary surface formed by the radiation 16 at the point of the collimator 18. In such embodiments, the filter substrate 20 and/or the support 42 may be curved such that radiation 16 which passes through the radially aligned openings 30 contacts the filter substrate 20 at or near the angle of incidence Ø. As will be appreciated, radially aligning the openings 30 to the radiation source 14 and curving the filter substrate 20 increases the available impact zone on the filter substrate 20, while simultaneously maintaining the likelihood that any radiation 16 contacting the filter substrate 20 will do so within the desired angle of incidence Ø.

Finally, it is also to be understood that the system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein, which may be accomplished in real-time. For example, as previously mentioned, the system may include at least one processor and system memory/data storage structures, which may include random access memory (RAM) and read-only memory (ROM). The at least one processor of the system may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer-readable medium. The term "computer-readable medium," as used herein, refers to any medium that provides or participates in providing instructions to the at least one processor of the system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a system for manufacturing a membrane filter is provided. The system includes a radiation source operative to emit radiation that contacts discrete portions of a filter substrate so as to facilitate the formation of openings within the filter substrate, and a collimator disposed between the filter substrate and the radiation source and operative to restrict some of the radiation from contacting the filter substrate. In certain embodiments, the system further includes an etcher operative to form the openings by removing the discrete portions of the filter substrate contacted by the radiation. In certain embodiments, the system further includes a radiation detector disposed on a side of the filter substrate opposite the radiation source and operative to obtain one or more measurements of a flux of the radiation across the filter substrate, and a controller operative to adjust the flux based at least in part on the one or more measurements. In certain embodiments, the controller adjusts the flux via the collimator. In certain embodiments, the collimator has one or more layers each having at least one opening for the radiation to pass through, and the controller adjusts the flux by adjusting an alignment of the openings. In certain embodiments, the radiation source is adjustable, and the controller adjusts the flux by adjusting the radiation source. In certain embodiments, the system further includes an adjustable support operative to move the filter substrate with respect to the collimator, and the controller adjusts the flux by adjusting the adjustable support. In certain embodiments, the radiation includes alpha particles. In certain embodiments, the openings in the filter substrate are operative to prevent particles greater than or equal to about 0.100 mm from passing through. In certain embodiments, the filter substrate is a polycarbonate film. In certain embodiments, the collimator has one or more openings that are radially aligned with the radiation source.

Other embodiments provide for a method for manufacturing a membrane filter. The method includes contacting discrete portions of a filter substrate with radiation emitted from a radiation source so as to facilitate the formation of openings within the filter substrate, and restricting some of the radiation via a collimator disposed between the filter substrate and the radiation source. In certain embodiments, the method further includes etching away the discrete portions of the filter substrate contacted by the radiation so as to form the openings. In certain embodiments, the method further includes obtaining, via a radiation detector, one or more measurements of a flux of the radiation across the filter substrate; and adjusting, via a controller, the flux based at least in part on the one or more measurements. In certain embodiments, adjusting, via the controller, the flux based at least in part on the one or more measurements includes adjusting an alignment of openings disposed in one or more layers of the collimator. In certain embodiments, adjusting, via the controller, the flux based at least in part on the one or more measurements includes adjusting the radiation source. In certain embodiments, adjusting, via the controller, the flux based at least in part on the one or more measurements includes moving the filter substrate with respect to the collimator. In certain embodiments, the openings in the filter substrate are operative to prevent particles greater than or equal to about 0.100 mm from passing through the filter substrate. In certain embodiments, adjusting, via the controller, the flux based at least in part on the one or more measurements includes at least one of: adjusting an alignment of openings disposed in one or more layers of the collimator; adjusting the radiation source; and moving the filter substrate with respect to the collimator.

Yet still other embodiments provide for a membrane filter. The membrane filter is formed by: contacting discrete portions of a filter substrate with radiation emitted from a radiation source so as to facilitate the formation of a plurality of openings within the filter substrate; and restricting some of the radiation via a collimator disposed between the filter substrate and the radiation source. The plurality of openings has an average uniformity of between about $300 \times 10^6/cm^2$ to about $1000 \times 10^6/cm^2$. In certain embodiments, the openings are operative to prevent particles greater than or equal to about 0.100 mm from passing through.

Yet still other embodiments provide for a membrane filter. The membrane filter includes a filter substrate including a plurality of openings having an average uniformity of between about $300 \times 10^6/cm^2$ to about $1000 \times 10^6/cm^2$. In certain embodiments, the openings are operative to prevent particles greater than or equal to about 0.100 mm from passing through. In certain embodiments, the filter substrate includes a material that becomes removable via etching after being exposed to radiation. In certain embodiments, the filter substrate is a polycarbonate film.

Accordingly, as will be appreciated, by using a collimator to selectively regulate the angle at which radiation contacts a filter substrate, e.g., a polycarbonate film, some embodiments of the present invention provide for a method of manufacturing membrane filters, e.g., track etched membrane filters, which have a more uniform distribution of openings/pores, and which also have a lower number of intersecting openings/pores, as compared to traditional methods of manufacturing such membranes. Thus, some embodiments of the present invention provide for membrane filters that have higher fineness and/or more predictable flow rates than membranes manufactured by traditional methods.

Further, by using an adjustable support, e.g., rollers and/or conveyors, to regulate the flux across a filter substrate that eventually forms a membrane filter, some embodiments of the present invention provide for a continuous, or near continuous, e.g., a non-batch, process for manufacturing membrane filters, i.e., filter substrates having openings formed/created therein. Accordingly, some embodiments of the present invention provide for significant improvements in manufacturing efficiencies over traditional batch-type methods.

Further still, by providing for the ability to control the flux across the filter substrate, some embodiments of the present invention provide for the ability to mass produce membrane filters customized to a specific requirement/intended use/process, e.g., a membrane filter having different portions with different/varying pore densities. As will be understood, such embodiments may also additionally reduce waste in manufacturing customized membrane filters, as compared to traditional methods.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A system for manufacturing a membrane filter comprising:
   a radiation source operative to emit radiation that contacts discrete portions of a filter substrate so as to facilitate the formation of openings within the filter substrate;
   a support for the filter substrate;
   a collimator disposed between the filter substrate and the radiation source and operative to restrict some of the radiation from contacting the filter substrate;
   a radiation detector disposed on a side of the filter substrate opposite the radiation source and operative to obtain one or more measurements of a flux of the radiation across the filter substrate: and
   a controller operative to adjust the flux based at least in part on the one or more measurements:
   wherein the controller adjusts the flux via the collimator.

2. The system of claim 1 further comprising:
   an etcher operative to form the openings by removing the discrete portions of the filter substrate contacted by the radiation.

3. The system of claim 1, wherein the collimator has one or more layers each having at least one opening for the radiation to pass through, and the controller adjusts the flux by adjusting an alignment of the openings.

4. The system of claim 1, wherein
   the radiation source is adjustable; and
   the controller adjusts the flux by adjusting the radiation source.

5. The system of claim 1, wherein the support comprises an adjustable support operative to move the filter substrate with respect to the collimator and wherein the controller adjusts the flux by adjusting the adjustable support.

6. The system of claim 1, wherein the radiation includes alpha particles.

7. The system of claim 1, wherein the openings in the filter substrate are operative to prevent particles greater than or equal to about 0.100 mm from passing through.

8. The system of claim 1, wherein the filter substrate is a polycarbonate film.

9. The system of claim 1, wherein the collimator has one or more openings that are radially aligned with the radiation source.

10. A method for manufacturing a membrane filter comprising:
    contacting discrete portions of a filter substrate with radiation emitted from a radiation source so as to facilitate the formation of openings within the filter substrate;
    restricting some of the radiation via a collimator disposed between the filter substrate and the radiation source;
    obtaining, via a radiation detector, one or more measurements of a flux of the radiation across the filter substrate: and
    adjusting, via the collimator, the flux based at least in part on the one or more measurements.

11. The method of claim 10, further comprising:
    etching away the discrete portions of the filter substrate contacted by the radiation so as to form the openings.

12. The method of claim 10, wherein adjusting, via the controller, the flux based at least in part on the one or more measurements comprises at least one of:
    adjusting an alignment of openings disposed in one or more layers of the collimator;
    adjusting the radiation source; and
    moving the filter substrate with respect to the collimator.

13. The method of claim 10,
    wherein the openings in the filter substrate are operative to prevent particles greater than or equal to about 0.100 mm from passing through the filter substrate.

14. A system for manufacturing a membrane filter comprising:
    a radiation source operative to emit radiation that contacts discrete portions of a filter substrate so as to facilitate the formation of openings within the filter substrate;
    a collimator disposed between the filter substrate and the radiation source and operative to restrict some of the radiation from contacting the filter substrate;
    a radiation detector disposed on a side of the filter substrate opposite the radiation source and operative to obtain one or more measurements of a flux of the radiation across the filter substrate;
    a controller operative to adjust the flux based at least in part on the one or more measurements; and
    an adjustable support operative to move the filter substrate with respect to the collimator;
    wherein the controller adjusts the flux by adjusting the adjustable support.

* * * * *